(12) United States Patent
Shi et al.

(10) Patent No.: US 12,328,109 B2
(45) Date of Patent: Jun. 10, 2025

(54) FILTER CIRCUIT AND ELECTRONIC DEVICE

(71) Applicant: ANHUI ANUKI TECHNOLOGIES CO., LTD., Anhui (CN)

(72) Inventors: Qilin Shi, Anhui (CN); Chengjie Zuo, Anhui (CN); Jun He, Anhui (CN)

(73) Assignee: Anhui ANUKI Technologies Co., Ltd., Anhui (CN)

( * ) Notice: Subject to any disclaimer, the term of this patent is extended or adjusted under 35 U.S.C. 154(b) by 0 days.

(21) Appl. No.: 18/022,053

(22) PCT Filed: Apr. 11, 2022

(86) PCT No.: PCT/CN2022/086074
§ 371 (c)(1),
(2) Date: Feb. 17, 2023

(87) PCT Pub. No.: WO2023/087606
PCT Pub. Date: May 25, 2023

(65) Prior Publication Data
US 2024/0275355 A1    Aug. 15, 2024

(30) Foreign Application Priority Data

Nov. 17, 2021 (CN) .......................... 202111360685.7

(51) Int. Cl.
*H03H 9/02* (2006.01)
*H03H 1/00* (2006.01)
*H03H 7/01* (2006.01)

(52) U.S. Cl.
CPC ...... *H03H 9/02818* (2013.01); *H03H 1/0007* (2013.01); *H03H 7/0161* (2013.01); *H03H 9/02086* (2013.01)

(58) Field of Classification Search
CPC .......... H03H 9/02818; H03H 9/02086; H03H 9/0538; H03H 9/542; H03H 1/0007; H03H 7/0161; H03H 7/0115
(Continued)

(56) References Cited

U.S. PATENT DOCUMENTS

2019/0081019 A1* 3/2019 Yamauchi ............... H01L 23/66
2023/0083961 A1* 3/2023 Komatsu .............. H03H 9/6476
333/193

FOREIGN PATENT DOCUMENTS

| CN | 110504942 A | 11/2019 |
| CN | 111342814 A | 6/2020 |

(Continued)

OTHER PUBLICATIONS

Machine English Translation of CN113411069 Published on Sep. 17, 2021 (Year: 2021).*

(Continued)

*Primary Examiner* — Jorge L Salazar, Jr.
(74) *Attorney, Agent, or Firm* — Davis Wright Tremaine LLP

(57) ABSTRACT

The present disclosure provides a filter circuit and an electronic device, and relates to the field of filters. The filter circuit can include a filter and a suppression ring, the suppression ring can be arranged around a periphery of the filter, the filter can include several grounded ports, each of grounded ports can be electrically connected to the suppression ring, and each of grounded ports can be grounded. The out-of-band rejection capability of the filter can be greatly improved by providing the suppression ring on the periphery of the filter and connecting each of grounded ports to the suppression ring before grounding.

12 Claims, 2 Drawing Sheets

(58) Field of Classification Search
USPC .................... 333/133, 186–188, 193–196
See application file for complete search history.

(56) References Cited

FOREIGN PATENT DOCUMENTS

| | | |
|---|---|---|
| CN | 112350684 A | 2/2021 |
| CN | 112532201 A | 3/2021 |
| CN | 113411069 A | 9/2021 |
| CN | 114070221 A | 2/2022 |
| JP | 2006014096 A | 1/2006 |
| JP | 2014082609 A | 5/2014 |

OTHER PUBLICATIONS

Internation Search Report and Written Opinion issued in related PCT Application No. PCT/CN2022/086074, on Jul. 22, 2022, 10 pages.
Japan Patent Office, "Notice of Reasons for Refusal", in Application No. 2023-510477, Apr. 11, 2024, 8 pages.

\* cited by examiner

FILTER CIRCUIT AND ELECTRONIC DEVICE

CROSS-REFERENCE TO RELATED APPLICATIONS

The present disclosure is a 371 U.S. National Phase of International Patent Application No. PCT/CN2022/086074, filed Apr. 11, 2022, entitled "FILTER CIRCUIT AND ELECTRONIC DEVICE," which claims priority to Chinese Patent Application No. 202111360685.7, filed Nov. 17, 2021, entitled "FILTER CIRCUIT AND ELECTRONIC DEVICE," the contents of which are incorporated herein by reference in their entirety.

TECHNICAL FIELD

The present disclosure relates to the field of filters, and in particular, to a filter circuit and an electronic device.

BACKGROUND ART

The filter is one of the essential key components in the radio frequency system, which is mainly used for frequency selection, so that the desired frequency signal can pass through and the unwanted interference frequency signal can be reflected.

Out-of-band rejection refers to the degree of suppression on signal outside pass-band by the filter. The out-of-band rejection performance of the filter is an important effect indicator, wherein the out-of-band rejection performance will directly affect the performance of the entire communication system, and the related filter often cannot effectively improve the out-of-band rejection performance.

SUMMARY

The present disclosure provides a filter circuit and an electronic device, which can effectively improve an out-of-band rejection capability of the filter.

In order to achieve the above purpose, the technical solutions adopted by some optional embodiments of the present disclosure are as follows.

The embodiments of the present disclosure provide a filter circuit, the filter circuit may comprise a filter and a suppression ring;
  the suppression ring may be arranged around a periphery of the filter; and
  the filter may comprise several grounded ports, each of the grounded ports may be electrically connected to the suppression ring, and each of the grounded ports may be grounded.

Optionally, the filter circuit may also comprise several inductors, each of the inductors may be provided outside the suppression ring, and each of the grounded ports may be grounded through one of the inductors.

Optionally, the filter may be an acoustic wave filter.
Optionally, the acoustic wave filter may be a SAW surface acoustic wave filter.
Optionally, the acoustic wave filter may be a BAW filter.
Optionally, the acoustic wave filter may be a FBAR filter.
Optionally, the filter may be a multi-frequency filter.
Optionally, the filter may be a single-frequency filter.
Optionally, the suppression ring may be a metal ring.
Optionally, the suppression ring may be an aluminum ring.
Optionally, the suppression ring may have a width of 10 um.
Optionally, a thickness of the suppression ring may be the same as a thickness of the filter.

The embodiments of the present disclosure also provide an electronic device, the electronic device may include the filter circuit.

Compared with the related art, the present disclosure has the following beneficial effects.

The present disclosure provides a filter circuit and an electronic device, the filter circuit can include a filter and a suppression ring, the suppression ring can be arranged around a periphery of the filter, the filter can include several grounded ports, each of grounded ports can be electrically connected to the suppression ring, and each of grounded ports can be grounded. The out-of-band rejection capability of the filter can be greatly improved by providing the suppression ring on the periphery of the filter and connecting each of grounded ports to the suppression ring before grounding.

BRIEF DESCRIPTION OF DRAWINGS

In order to illustrate the technical solutions of the embodiments of the present disclosure more clearly, the drawings need to be used in the embodiments will be briefly introduced below, it should be understood that the following drawings only show some embodiments of the present disclosure, and therefore should not be regarded as a limitation of the scope, and for those ordinarily skilled in the art, other relevant drawings can also be obtained in light of these drawings, without using any inventive efforts.

Figure 1:
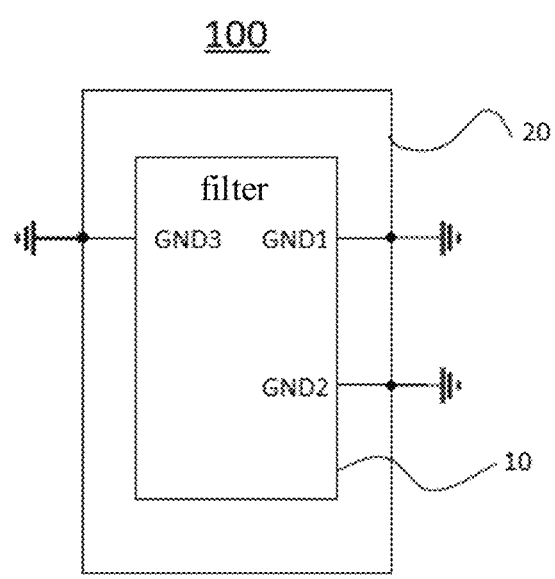
FIG. 1 is a first circuit diagram of a filter circuit provided by an embodiment of the present disclosure.

Reference numerals: 100—filter circuit; 10—filter; 20—suppression ring.

DETAILED DESCRIPTION OF EMBODIMENTS

As described in the background art, the filter is one of the essential key components in the radio frequency system, which is mainly used for frequency selection, so that the desired frequency signal can pass through and the unwanted interference frequency signal can be reflected.

Out-of-band rejection refers to the degree of suppression on signal outside pass-band by the filter. The out-of-band rejection performance of the filter is an important effect indicator, wherein the out-of-band rejection performance will directly affect the performance of the entire communication system, and the related filter often cannot effectively improve the out-of-band rejection performance.

The problems existing in the related art are all the results obtained by the inventor after practice and careful research, therefore, the discovery process of the above-mentioned problems and the solutions to the above-mentioned problems proposed in the following embodiments of the present disclosure should be the contribution made by the inventor in the process of invention.

In order to make the purposes, technical solutions and advantages of the embodiments of the present disclosure clearer, the technical solutions in the embodiments of the present disclosure will be clearly and completely described below with reference to the drawings in some embodiments of the present disclosure, obviously, the embodiments described are part of the embodiments of the present disclosure, rather than all embodiments. The components of the embodiments of the present disclosure, which are generally described and shown in the drawing herein, may be arranged and designed in a variety of different configurations.

Therefore, the following detailed description of the embodiments of the present disclosure provided in the drawings is not intended to limit the claimed scope of the present disclosure, but merely represents selected embodiments of the present disclosure. Based on the embodiments of the present disclosure, all other embodiments obtained by those ordinarily skilled in the art, without making inventive effort, fall within the protection scope of the present disclosure.

It should be noted that similar reference numerals and letters indicate similar items in the following drawings, therefore, once a certain item is defined in one drawing, it does not need to be further defined and explained in the subsequent drawings.

In the description of the present disclosure, it should be noted that the orientation or positional relationship indicated by the terms "upper", "lower", "inner", "outer" etc. are based on the orientation or positional relationship as shown in the drawings, or it is the orientation or positional relationship that the product of the invention is usually placed in use, merely for facilitating the description of the present disclosure and simplifying the description, rather than indicating or implying that related devices or elements have to be in the specific orientation, or configured or operated in a specific orientation, therefore, they should not be construed as limitations on the present disclosure.

Besides, terms "first", and "second" etc., if appear, are merely for distinguishing the description, but should not be construed as indicating or implying importance in relativity.

The term "comprising" or any other variation thereof is intended to encompass non-exclusive inclusion such that a process, method, article or device comprising a list of elements includes not only those elements, but also other elements not expressly listed, or also elements inherent to such process, method, article or device.

Some embodiments of the present disclosure will be described in detail below with reference to the drawings. It should be noted that the features in the embodiments of the present disclosure can be combined with each other without conflict.

In order to better understand the technical solutions provided by the embodiments of the present disclosure, some professional terms that may be involved in the present disclosure are introduced in detail below.

As for filter, the filter is one of the essential key components in the radio frequency system, which is mainly used for frequency selection, allowing the desired frequency signal to pass through and reflecting the unwanted interference frequency signal.

Classic application example of the filter is the front end of receiver or transmitter.

Filters are widely used in the radio frequency, intermediate frequency and baseband parts of receivers. With the development of digital technology, digital filters are used to replace the analog filters in the baseband part and even the intermediate frequency part, but the filters in the radio frequency part are still irreplaceable. Therefore, the filter is one of the essential key components in the radio frequency system.

At present, there are many methods to classify filters, for example, the filters can be classified as: low-pass, high-pass, band-pass, and band-stop filters, etc. according to characteristics of frequency selection;

the filters can be classified as: LC filter, surface acoustic wave or bulk acoustic wave filter, spiral filter, dielectric filter, cavity filter, high-temperature superconducting filter and planar structure filter, etc. according to the implementation method; and the filters can be classified as: Chebyshev, generalized Chebyshev, Butterworth, Gaussian, Bessel function and elliptic function, etc. according to different frequency response functions.

The many different characteristics of filters described by the many classification methods of filters all embody the need for comprehensive consideration of the filter requirements in practical engineering applications, that is to say, when designing for user needs, it is necessary to comprehensively consider user needs.

When choosing a filter, the first thing to be determined is whether to use low-pass, high-pass, band-pass or band-stop filters.

The most commonly used filters are low-pass and band-pass filters. The low-pass filter is widely used in an image suppression of the mixer part and a harmonic suppression of the frequency source part, etc. The band-pass filter is widely used in a signal selection of the front end of receiver, a post-spurious suppression of the transmitter power amplifier, and a spurious suppression of frequency source, etc.

Filters are widely used in microwave radio frequency systems. As a functional component, there must be corresponding electrical performance indicators to describe the performance requirements of the system for this component.

Corresponding to different application scenario, there are different requirements for some electrical performance characteristics of the filter.

Some electrical performance technical indicators of filter are selected to be described in detail below.

Order (series): for high-pass and low-pass filters, the order is the sum of the number of capacitors and inductors in the filter. For a band-pass filter, the order is the total number of parallel resonators; for a band-stop filter, the order is the total number of series resonators and parallel resonators. Generally speaking, the filter is often multi-order, and also has a plurality of grounded ports.

Out-of-band rejection: the "attenuation amount" outside the pass-band frequency range of the filter, which represents the filter's ability to select unwanted frequency signals.

Refer to FIG. 1, an embodiment of the present disclosure provides a filter circuit 100, which can effectively improve the out-of-band rejection capability of the filter 10.

The filter circuit 100 may comprise a filter 10 and a suppression ring 20.

The suppression ring 20 may be arranged around a periphery of the filter 10.

The filter 10 may comprise several grounded ports, each of the grounded ports may be electrically connected to the suppression ring 20, and each of the grounded ports is grounded.

The filter circuit 100 provided in this embodiment can greatly improve the out-of-band rejection capability of the filter 10 by providing the suppression ring 20 on the periphery of the filter 10 and connecting each of the grounded ports to the suppression ring 20 before grounding.

It should be noted that several grounded ports in this embodiment may be one or multiple grounded ports. In practical applications, since the filter 10 is often multi-order, there are often multiple grounded ports, three grounded ports are only taken as an example in FIG. 1, which does not mean that there can only be three grounded ports.

It can be understood that the filter circuit 100 provided in this embodiment of the present disclosure may further include other lumped elements, and the lumped elements may be selected according to actual needs, which will not be repeated in this embodiment.

In this embodiment, the suppression ring 20 may be arranged around the periphery of the filter 10, and the so-called surrounding arrangement may be that the suppression ring 20 is arranged around the periphery of the filter 10 in parallel, or may also be other surrounding manners.

Figure 2:
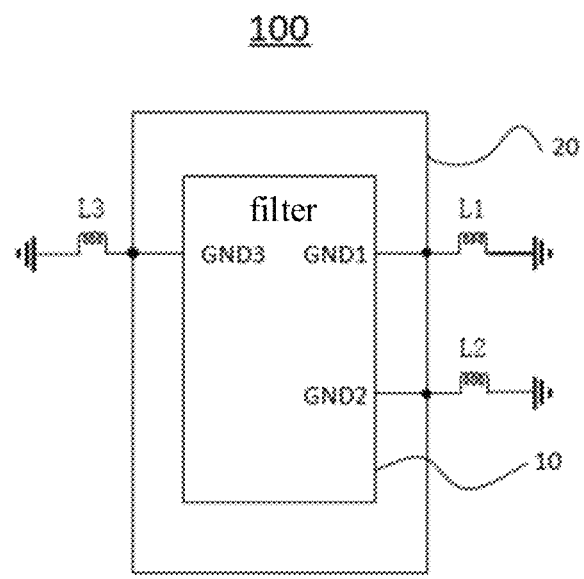
FIG. 2 is a second circuit diagram of the filter circuit provided by an embodiment of the present disclosure.

Referring to FIG. 2, in another possible embodiment, the filter circuit 100 may further include several inductors, each of inductors may be provided outside the suppression ring 20, and each of the grounded ports may be grounded through an inductor.

It should be noted that, in this embodiment, the number of inductors can correspond to the number of grounded ports, and each of inductors can function as a grounding inductor.

In another optional embodiment, the filter 10 may be an acoustic wave filter.

The acoustic wave filter may be a SAW surface acoustic wave filter.

The SAW surface acoustic wave filter is a type of transduction positive band-pass filter made by using piezoelectric effect of piezoelectric ceramic, lithium niobate, quartz and other piezoelectric quartz crystal oscillator materials and the physical properties of surface acoustic wave propagation, which is a special filter device made of piezoelectric materials such as quartz crystal and piezoelectric ceramics, and using piezoelectric effect thereof and the physical properties of surface acoustic wave propagation.

The SAW surface acoustic wave filters are widely used in color TVs, mobile phones, GPS positioning, satellite communications and cable television and other electrical equipment.

Optionally, the filter 10 may also be a BAW filter.

Compared to the SAW surface acoustic wave filter, the BAW filter is more suitable for high frequency. The same as SAW/TC-SAW filter, the size of the BAW filter decreases with increasing frequency. In addition, the BAW filter has the advantages of insensitivity to temperature changes, small insertion loss, and large out-of-band attenuation.

While the SAW and TC-SAW filters are well suitable for applications within about 1.5 GHZ, the BAW filter has a very good performance advantage when being above 1.5 GHZ, the size of the BAW filter also shrinks with increasing frequency, which makes it very suitable for 3G and 4G applications with very strict requirements. In addition, even in high-bandwidth designs, the BAW filter is less sensitive to temperature changes, simultaneously, it further has very low losses and very steep filter skirts.

Optionally, the filter 10 may also be a FBAR filter.

FBAR filter is the abbreviation of film bulk acoustic resonator filter. The FBAR filter is different from previous filters. It is manufactured by using silicon substrate, by means of mems technology and thin-film technology. The FBAR filter at this stage already has the characteristics slightly higher than that of the ordinary saw filter.

As for the application of FBAR filter in the next generation of wireless communication and wireless access products, today's wireless mobile products are developing towards the fusion and integration of multi-function, multi-frequency band, multi-system and multi-protocol in addition to the higher and higher requirements for volume and power saving. For example, gsm, cdma, wcdma and gps, bluetooth, wifi, wimax and other different functions are combined in one product. This also has challenges in design and mass production, and designers should consider maturity and sustainability of technology when choosing solutions.

It should be noted that, in this embodiment, the filter 10 includes but is not limited to the above-mentioned SAW, BAW and FBAR filters, and may also be any other form of acoustic wave filters.

Figure 3:
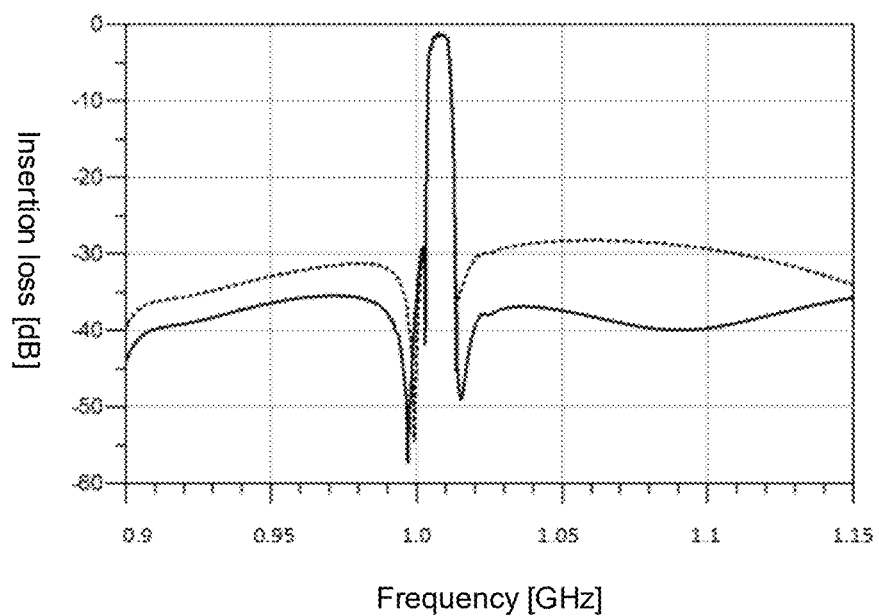
FIG. 3 is a performance parameter comparison diagram provided by an embodiment of the present disclosure.

Refer to FIG. 3, FIG. 3 is a comparison diagram of the performance parameters between the filter circuit 100 provided by the embodiments of the present disclosure and the traditional circuit, obtained through experiments, wherein the solid line in the figure is the performance parameter curve of the filter circuit 100, and the dashed line is the performance parameter curve of the traditional circuit. It is proved by experiments that the performance parameters of the present disclosure are obviously better than those of traditional circuits, and the filter circuit 100 provided by the embodiments of the present disclosure can greatly increase the out-of-band rejection capability of the filter.

Optionally, the filter 10 is a multi-frequency filter.

Optionally, the filter 10 is a single-frequency filter.

In another possible embodiment, the suppression ring 20 may be a metal ring.

As a preferred embodiment, the suppression ring 20 may be an aluminum ring.

In another optional embodiment, the width of the suppression ring 20 may be 10 um.

It should be noted that, in this embodiment, the width of the suppression ring 20 is 10 um, which is only a preferred embodiment. In a specific application scenario, the width of the suppression ring 20 can be designed according to the precision of the process and the out-of-band rejection specification of the filter 10.

Optionally, the thickness of the suppression ring 20 may be the same as the thickness of the filter 10.

The present disclosure also provides an electronic device, which may include the above-mentioned filter circuit 100.

It should be noted that, in this embodiment, the filter 10 has a chip structure, and the suppression ring 20 and the filter 10 have the same thickness, which can effectively improve the effect of out-of-band rejection.

The above are only specific embodiments of the present disclosure, but the protection scope of the present disclosure is not limited thereto, any changes or substitutions that can be easily conceived by any person skilled in the art within the technical scope disclosed in the present disclosure should be included within the protection scope of the present disclosure. Therefore, the protection scope of the present disclosure should be subjected to the protection scope of the claims.

INDUSTRIAL APPLICABILITY

The present disclosure provides a filter circuit and an electronic device, the filter circuit includes a filter and a suppression ring, wherein the suppression ring is arranged around a periphery of the filter, the filter includes several grounded ports, each of grounded ports is electrically connected to the suppression ring, and each of grounded ports is grounded. The out-of-band rejection capability of the filter can be greatly improved by providing the suppression ring on the periphery of the filter and connecting each of grounded ports to the suppression ring before grounding.

Furthermore, it will be appreciated that the filter circuits and electronic devices of the present disclosure are reproducible and can be used in a variety of industrial applications. For example, the filter circuits and electronic devices of the present disclosure can be used in the field of filters.

What is claimed is:

1. A filter circuit, wherein the filter circuit comprises a filter and a suppression ring, wherein;
   the suppression ring is arranged around a periphery of the filter; and
   the filter comprises several grounded ports, each of the grounded ports is electrically connected to the suppression ring, and each of the grounded ports is grounded,
   wherein the filter circuit further comprises several inductors, each of the inductors is provided outside the suppression ring in a circumferential direction, and each of the grounded ports is grounded through one of the inductors.

2. The filter circuit according to claim 1, wherein the filter is an acoustic wave filter.

3. The filter circuit according to claim 2, wherein the acoustic wave filter is a SAW surface acoustic wave filter.

4. The filter circuit according to claim 2, wherein the acoustic wave filter is a BAW filter.

5. The filter circuit according to claim 2, wherein the acoustic wave filter is a FBAR filter.

6. The filter circuit according to claim 1, wherein the filter is a multi-frequency filter.

7. The filter circuit according to claim 1, wherein the filter is a single-frequency filter.

8. The filter circuit according to claim 1, wherein the suppression ring is a metal ring.

9. The filter circuit according to claim 1, wherein the suppression ring is an aluminum ring.

10. The filter circuit according to claim 1, wherein the suppression ring has a width of 10 um.

11. The filter circuit according to claim 1, wherein a thickness of the suppression ring is the same as a thickness of the filter.

12. An electronic device, comprising the filter circuit according to claim 1.

* * * * *